US006881369B2

United States Patent
Lee et al.

(10) Patent No.: US 6,881,369 B2
(45) Date of Patent: Apr. 19, 2005

(54) MICROELECTROFORMING MOLD USING A PREFORMED METAL AS THE SUBSTRATE AND THE FABRICATION METHOD OF THE SAME

(75) Inventors: Yuh-Wen Lee, Taoyuan Hsien (TW); Liang-Yu Yao, Taipei Hsien (TW); Chao-Chiun Liang, Taichung (TW); Jeng-En Juang, Taipei Hsien (TW); Ching-Yi Wu, Hsinchu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 280 days.

(21) Appl. No.: 10/124,312

(22) Filed: Apr. 18, 2002

(65) Prior Publication Data

US 2003/0199163 A1 Oct. 23, 2003

(51) Int. Cl.[7] .............................................. B29C 33/38
(52) U.S. Cl. ..................... 264/219; 264/328.1; 249/135; 205/70; 205/114; 228/194
(58) Field of Search ................................ 264/219, 293, 264/328.1; 164/6; 249/134, 135; 430/320, 321, 325, 326, 330; 228/194, 195, 233.2; 205/70, 114

(56) References Cited

U.S. PATENT DOCUMENTS

| | | | |
|---|---|---|---|
| 6,644,537 B1 * | 11/2003 | Chiu et al. | 228/256 |
| 6,699,643 B2 * | 3/2004 | Asukata | 430/315 |
| 2002/0093119 A1 * | 7/2002 | Morale | 264/225 |
| 2002/0115016 A1 * | 8/2002 | Warren | 430/259 |

FOREIGN PATENT DOCUMENTS

JP         2003245925      *  9/2003

OTHER PUBLICATIONS

The American Heritage Dictionary for the English Language, 4th Ed., definition for "aspect ratio" (as provided at http://education.yahoo.com/reference/dictionary/entry/aspect+ ratio).*

* cited by examiner

Primary Examiner—James P. Mackey
Assistant Examiner—Donald Heckenberg
(74) Attorney, Agent, or Firm—Birch, Stewart, Kolasch & Birch, LLP

(57) ABSTRACT

The invention discloses a microelectroforming mold using a preformed metal as the substrate and its fabrication method. Using a preformed metal as the substrate can avoid deformation of the microelectroforming mold due to residual stress in the electroforming metal. The fabrication method disclosed herein includes the steps of: forming a layer of bonding material on a surface of the preformed metal substrate after machining; forming a high aspect ratio photoresist microstructure on surfaces of the metal substrate and the bonding material; putting an electroforming material into the gaps of the photoresist microstructure to form an electroforming metal microstructure; and using a thermal process to bond the metal substrate and the metal micro structure by the bonding material and simultaneously burn off the photoresist microstructure to form a microelectroforming mold. The invention shortens the electroforming time to be one third of the prior art, elongating the number of times the micro-electroforming mold can be used by a factor of more than three.

16 Claims, 2 Drawing Sheets

MICROELECTROFORMING MOLD USING A PREFORMED METAL AS THE SUBSTRATE AND THE FABRICATION METHOD OF THE SAME

BACKGROUND OF THE INVENTION

1. Field of Invention

The invention relates to a microelectroforming mold using a preformed metal as its substrate and the fabrication method of the same. More particularly, this invention relates to a microelectroforming mold that uses a bonding material to combine a metal substrate and a metal microstructure, forming a preformed metal substrate, and the fabrication method of the same.

2. Related Art

With the advance in technologies, miniaturization is the trend in the microelectronic industry. Microengineering techniques are thus developed to perform mass production to lower the manufacturing costs for microelectronic devices. Developed in Germany, the LIGA (which is called Lithographie, Galvanoformung, and Abformung, meaning synchrotron radiation lithography, galvano forming, and plastic molding) procedure integrates deep X-ray lithography, micro-electroforming, micro-injection and micro-embossing in the micro engineering techniques is an optimal method for mass-producing high aspect ratio and high precision microengineered components among others. The standard LIGA procedure uses high-energy synchrotron radiation as its lithography X-ray source to make sub-millimeter microstructures. There is a wide selection of materials that this procedure can apply to. For example, it can be used to manufacture metal and plastic microstructures. With these advantages, LIGA is recognized as the best technique for fabricating high aspect ratio and high precision 2D and 3D microengineered components. However, this technique has the problems of high tooling costs, a complicated procedure, and a long manufacturing time, LIGA-like procedures using UV light, laser or plasma as the light source has become another growing trend in the field.

LIGA-like procedures using SU-8 negative type photoresist can employ UV light to get high aspect ratio microstructures. The method using UV light as the lithography light source is called the UV-LIGA procedure. With the use of the electroforming technique, a high aspect ratio microengineered electroforming mold can be made. Taking the microengineered electroforming mold and directly applying it to plastic injection and micro-embossing can mass-produce low-cost microengineered elements. In addition, most of current electroforming techniques used in the UV-LIGA procedure use silicon wafers as the substrate. The silicon wafer surface is formed with a metal thin film (called a seed layer) by vapor deposition to make it conductive. Photoresist is then applied on the silicon wafer surface to define a microstructure. The silicon wafer surface and the photoresist surface are electroformed to duplicate the micro structure. After the silicon wafer and the photoresist are removed, one finally performs machining to adjust the size, obtaining an electroformed mold. The microelectroforming technique mentioned above has to electroform a metal to a thickness of the millimeter order so as to achieve the bulk strength required by the microelectroforming mold. The residual stress in the electroformed metal increases with the thickness of the electroformed metal. Therefore, the microelectroforming mold is likely to deform in shape. In addition, subsequent machining will also produce stress in the material to deform the mold. This deformation is very hard to control in current technology. Moreover, the SU-8 negative type photoresist becomes cured resin after the exposure that is difficult to be removed from the electroforming mold, affecting subsequent plastic injection and micro-embossing. The precision control of the microengineered components thus becomes the bottleneck of the UV-LIGA procedure, greatly restricting the development of this technique.

To avoid the deformation problem in the electroforming molds, one has to remove the residual stress in electroforming. The residual stress in turn depends upon many factors, such as the composition, pH value, temperature, additives, heavy metal impurities of the plating solution. These parameters can be controlled in the electroforming procedure in practice. For instance, using proper additives can reduce the residual stress. However, many other factors may change local current densities. For example, changes in geometrical shapes of the microstructures, designs of the plating bath, electroforming mold structure and material will all change the local current densities, resulting in residual stress that deforms the electroforming mold structure. Another method of reducing the residual stress in electro forming molds is to use a material the same as the electroforming metal (such as nickel) as the substrate instead of using the silicon wafer. Nevertheless, this metal substrate manufacturing procedure renders only a machine bonding strength between the electroforming mold microstructure and the metal substrate. The bonding is so bad that it does not meet the strength and multiple use requirements for a mold.

SUMMARY OF THE INVENTION

An objective of the invention is to avoid bending deformation of the microelectroforming mold. The invention provides a microelectroforming mold made by combining a metal substrate and an electroforming metal microstructure using a bonding material. During the thermal processing procedure, the bonding material connects the metal substrate and the electroforming metal microstructure. The cured photoresist material is removed at the same time to avoid the user of strippers and to simplify the manufacturing procedure. The mold thus made satisfies the requirements of high rigidity, high intensity, high precision, long lifetime, and resistance to thermal impacts by microengineered molds in plastic injection, micro-embossing, and alloy casting.

The disclosed method includes the steps of: forming a layer of bonding material on a surface of a preformed metal substrate after polishing and machining; applying photoresist to the metal substrate surface using a spin coating machine; defining a microstructure pattern using a photo mask and UV light, forming a high aspect ratio photoresist microstructure after exposure; putting an electroforming material into gaps in the photoresist microstructure to form an electroforming metal microstructure, avoiding deformation due to further machining after the photoresist microstructure is removed; using a thermal process with temperature between 200 to 1200 degrees of Celsius to bond the metal substrate and the metal microstructure together by the bonding material and to remove the photoresist, which can also be removed using a stripper.

The disclosed microelectroforming mold contains a metal substrate, whose surface is polished. The positioning mechanism or holding part needed by a plastic injection machine and a micro-embossing machine to be used in subsequent procedure is prepared in advance. The metal substrate surface is covered by a bonding material and an electroforming material. The electroforming material forms a metal microstructure on the metal substrate surface. The bonding material combines the metal microstructure of the electro forming material and the metal substrate into a micro electroforming mold. The metal substrate can be made of tool steel, nickel-based alloys, cobalt-based alloys, iron-based alloys, and metal mold materials. The bonding materials can be either hard-bond materials or soft-bond materials. The hard-bond materials include silver-based alloys, chromium-based alloys, nickel-based alloys, and copper-base alloys. The metal microstructure formed from the electroforming material has a height from 10 $\mu$m to 1500 $\mu$m. The aspect ratio of the microstructure pattern is between 1 and 30. The electroforming material is selected from nickel, nickel-cobalt alloys, nickel-tungsten alloys, and additive alloy particles for increasing the rigidity.

According to the disclosed microelectroforming mold and its fabrication method, the positioning mechanism or holding part needed by the plastic injection machine and the micro-embossing machine to be used in subsequent procedure is prepared in advance to avoid microelectroforming mold deformation due to subsequent machining. A photoresist microstructure pattern is formed on the metal substrate. An electroforming material is inserted into gaps in the photoresist microstructure pattern. Since the invention does not need to completely cover the photoresist material but only fills the gaps in the microstructure pattern, it greatly shortens the electroforming time to one third of the prior art. A thermal process is used to bond the metal substrate and the electroforming metal microstructure by the bonding material to form the microelectroforming mold and to burn off the photoresist. This can prevent the use of photoresist strippers and simplify the procedure. The microelectroforming mold formed from the metal substrate and the electroforming metal microstructure has a curvature due to internal stress close to zero; whereas the curvature radius of the microelectroforming mold prepared in the prior art is about 300 $\mu$m. The disclosed microelectroforming mold can be used in micro-embossing for 10000 times; whereas the microelectroforming mold in the prior art can be used for only 3000 times or so. Therefore, one sees that the invention can be used to make higher precision components, to reduce the use of strippers, and to elongate the mold lifetime.

BRIEF DESCRIPTION OF THE DRAWINGS

The invention will become more fully understood from the detailed description given hereinbelow illustration only, and thus are not limitative of the present invention, and wherein.

DETAILED DESCRIPTION Of THE INVENTION

The microelectroforming mold of the invention uses a preformed metal as its substrate. The surface of the metal substrate is polished. The positioning mechanism or holding part of the plastic injection machine and micro-embossing machine to be used in subsequent procedure is prepared in advance. The metal substrate and the electroforming metal microstructure are bonded together to form a microelectroforming mold. Since the curvature of the microelectroforming mold due to the internal stress is close to zero and the positioning mechanism or holding part needed in the subsequent procedure has been finished without further machining, deformation of the microelectroforming mold can be avoided. Therefore, the microelectroforming mold using a preformed metal as its substrate according to the invention and the fabrication method can be applied to microengineered tools that require high precision.

Pursuant to the objectives of the invention, the disclosed fabrication method includes the steps: forming a layer of bonding material on a surface of a preformed metal substrate; applying a photoresist material to a bonding material layer of the metal substrate surface; defining a pattern on the photoresist material using a photo mask and UV light; forming a desired microstructure by exposing and developing the photoresist material; providing an electroforming material and putting the electroforming material into gaps in the photoresist microstructure to form an electroforming metal microstructure; using a thermal process to bond the metal substrate and the metal microstructure together and to remove the photoresist.

Figure 1:
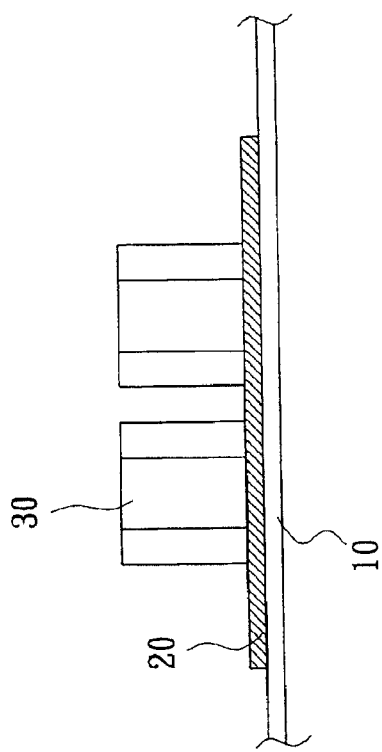
FIGS. 1 through 4 are schematic cross-sectional view of a preferred embodiment manufacturing procedure of the invention.

FIGS. 1 through 4 show schematic cross-sectional views of an embodiment of the invention. As shown in FIG. 1, a bonding material 20 is coated onto a surface of a metal substrate 10 prepared by polishing and acetone washing. The metal substrate 10 is made of tool steel, nickel-based alloys, cobalt-based alloys, iron-based alloys, and metal mold materials. The metal substrate 10 can be used to make the positioning mechanism and holding part needed in a plastic injection machine and a micro-embossing machine. The bonding material 20 is coated onto the metal substrate surface 10 by electroplating, chemical plating, PVD (physical vapor deposition), CVD (chemical vapor deposition), or thermal spray. The thickness of the bonding material 20 is 0.1 $\mu$m to 10 $\mu$m. The bonding material 20 has to have diffusive and bonding functions and does not change to its liquid phase during the thermal process, preventing deformation from happening. The bonding material 20 can be either hard-bond materials or soft-bond materials. The hard-bond materials include silver-based alloys, chromium-based alloys, nickel-based alloys, and copper-base alloys.

Figure 2:
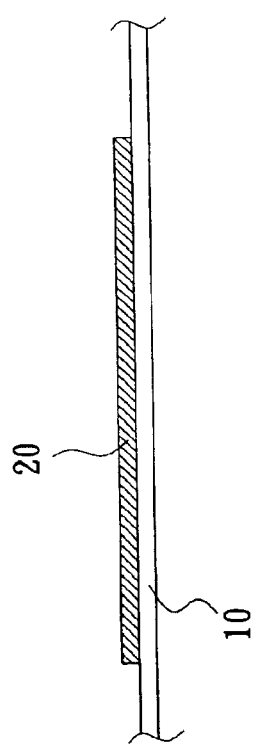
Figure 3:
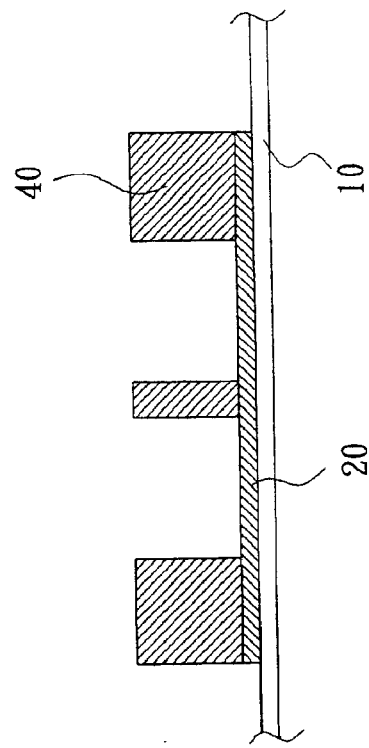
Figure 4:
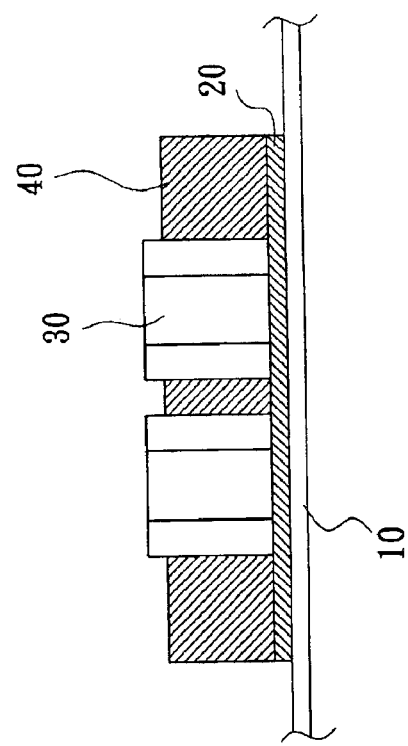

With reference to FIG. 2, a photoresist material is applied to the meal substance surface 10 by spin coating. UV light along with a photo mask is used to define a photoresist pattern. After exposure and development, a high aspect ratio photoresist microstructure 30 with a height between 10 $\mu$m and 1500 $\mu$m and the aspect ratio between 1 and 30 is obtained. Aspect ratio is defined as the ratio of height to width of the microstructure or micro pattern. In other words, the height of the structure (e.g., microstructure 30 in FIG. 3 and microstructure 40 in FIG. 4) divided by the width thereof is termed as aspect ratio. The photoresist material can be either positive-type or negative-type. As shown in FIG. 3, an electroforming material fills gaps in the photoresist microstructure 30, forming a metal microstructure 40. The electroforming material can be nickel, nickel-cobalt alloys, nickel-tungsten alloys, and additive alloy particles for increasing the rigidity. After electroforming, one can polish the electroforming material to make its height even, prevent possible deformation due to further machining after removing the photoresist. FIG. 4 shows that a thermal process is employed to bond the metal microstructure 30 to form a desired microelectroforming mold. The temperature in the thermal process is a vacuum thermal process, an atmosphere thermal process, or a gas-filled thermal process. The photoresist material on the photoresist microstructure 30 can also be removed using a solution.

Through the above method, the invention can make molds with high rigidity, high intensity, high precision, long lifetime and resistance to thermal impacts. They exactly satisfy the requirements for plastic injection, micro-embossing, and alloy casting.

Figure 5:
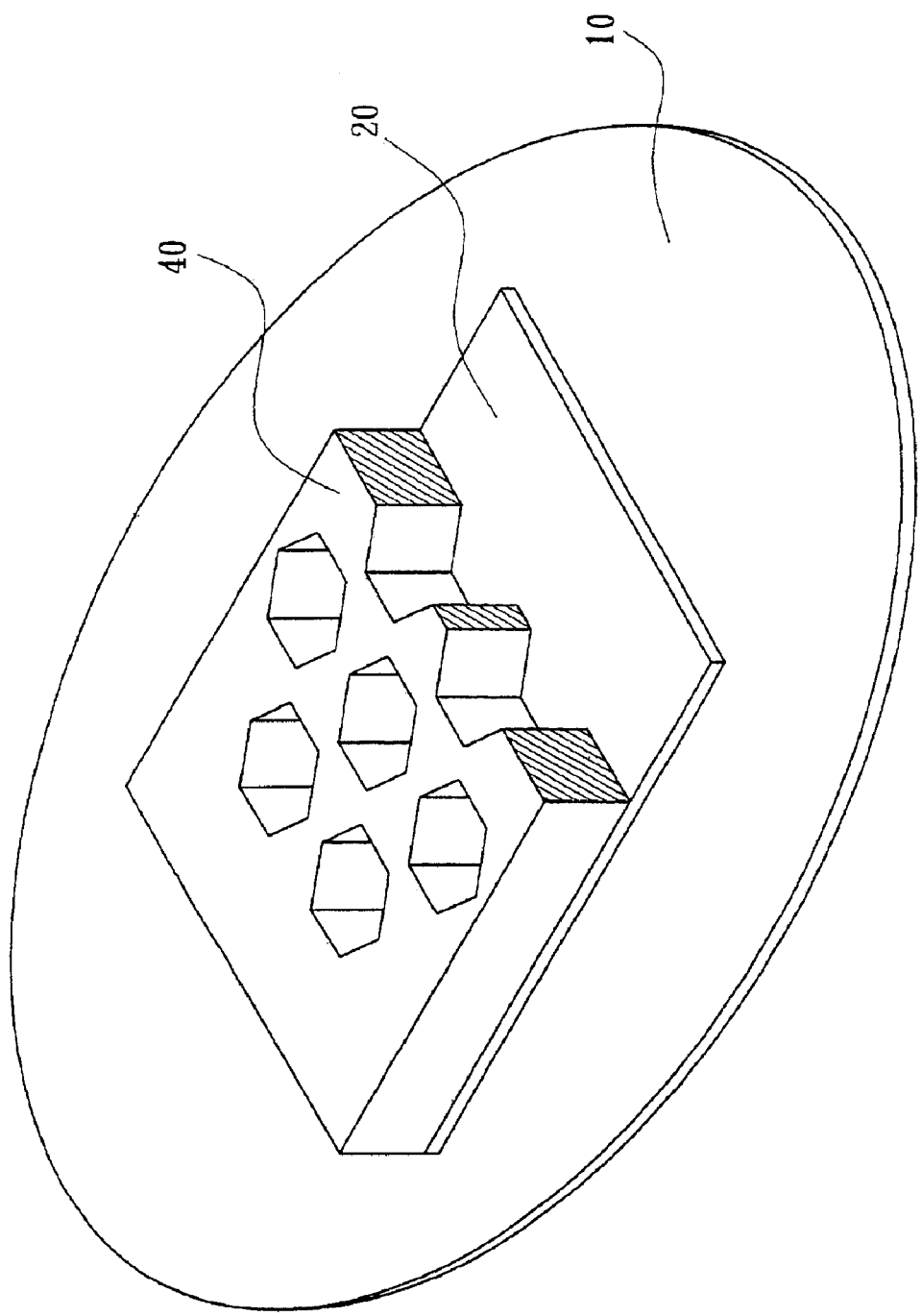
FIG. 5 is a three-dimensional diagram of the microelectroforming mold using a preformed metal as its substrate according to an embodiment of the invention.

With reference to FIG. 5, the microelectroforming mold in an embodiment of the invention includes: a preformed metal substrate 10 with its surfaces being polished and a bonding material covering the surface of the metal substrate 10. The bonding material 20 bonds the metal micro structure 40 and the metal substrate 10 to form a micro electroforming mold. The bonding method is either chemical diffusion or physical welding. The microelectroforming mold can be used in plastic injection and micro-embossing to mass-produce microengineered plastic components, and used in aluminum alloy, zinc alloy and magnesium alloy casting to mass-produce microengineered metal components. The material and fabrication method of the above-mentioned structure are the same as the materials and method described before, and therefore are not repeated here.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A fabrication method of a microelectroforming mold using a preformed metal as a substrate, which comprises the steps of:

providing a preformed metal substrate with its surface being polished;

forming a layer of bonding material on a surface of the preformed metal and applying a photoresist material on the bonding material;

defining a pattern on the photoresist material;

providing an electroforming material and putting the electroforming material into gaps in the photoresist microstructure to form an electroforming metal microstructure; and performing a thermal process to bond the metal substrate and the metal microstructure together and to remove the photoresist.

2. The fabrication method of claim 1, wherein the preformed metal substrate is made of a material selected from the group consisting of tool steel, nickel-based alloys, cobalt-based alloys, iron-based alloys, and metal mold materials.

3. The fabrication method of claim 1, wherein the preformed metal substrate is used to prepare a positioning mechanism and a holding part needed in a plastic injection machine and a micro-embossing machine in advance.

4. The fabrication method of claim 1, wherein the bonding material is selected from the group consisting of hard-bond materials and soft-bond materials.

5. The fabrication method of claim 4, wherein the hard-bond materials include silver-based alloys, chromium-based alloys, nickel-based alloys, and copper-base alloys.

6. The fabrication method of claim 1, wherein the photoresist material is selected from the group consisting of positive-type photoresist materials and negative-type photoresist materials.

7. The fabrication method of claim 1, wherein after exposing and developing the photoresist forms a micro structure pattern with a height between 10 $\mu$m and 1500 $\mu$m and an aspect ratio between 1 and 30.

8. The fabrication method of claim 1, wherein the electroforming material is selected from the group consisting of nickel, nickel-cobalt alloys, nickel-tungsten alloys, and additive alloy particles for increasing the rigidity.

9. The fabrication method of claim 1 further comprising the step of polishing the microelectroforming mold to make its surface even after electroforming.

10. The fabrication method of claim 1, wherein the removal of the photoresist material is done using a method selected from the group consisting of a vacuum thermal process, an atmosphere thermal process, a gas-filled thermal process and a solution.

11. The fabrication method of claim 1, wherein the thermal process of the microelectroforming mold is done using a method selected from the group consisting of a vacuum thermal process, an atmosphere thermal process, a gas-filled thermal process and a solution.

12. The fabrication method of claim 1, wherein the thermal process temperature for the microelectroforming mold is between 200 and 1200 degrees of Celsius, bonding the electroforming material and the preformed metal substrate with the bonding material.

13. The fabrication method of claim 1, wherein microelectroforming mold is used in plastic injection and micro-embossing for mass production of microengineered plastic components.

14. The fabrication method of claim 1, wherein microelectroforming mold is used in aluminum alloy, zinc alloy, and magnesium alloy casting for mass production of microengineered metal components.

15. The fabrication method of claim 1, wherein the bonding material is formed by coating.

16. The fabrication method of claim 15, wherein the coating method is selected from the group consisting of electroplating, chemical plating, PVD (physical vapor deposition), CVD (chemical vapor deposition), and thermal spray and with the thickness of the bonding material between 0.1 $\mu$m and 10 $\mu$m.

* * * * *